United States Patent [19]

Johnson et al.

[11] Patent Number: 4,879,631
[45] Date of Patent: Nov. 7, 1989

[54] SHORT-RESISTANT DECOUPLING CAPACITOR SYSTEM FOR SEMICONDUCTOR CIRCUITS

[75] Inventors: Gary M. Johnson; Leland R. Nevill, both of Boise, Id.

[73] Assignee: Micron Technology, Inc., Boise, Id.

[21] Appl. No.: 298,736

[22] Filed: Jan. 18, 1989

[51] Int. Cl.[4] .............................................. H05K 7/20
[52] U.S. Cl. .................................... 361/386; 361/321
[58] Field of Search ..................... 357/14, 23.5, 23.7; 174/68.5, 52 FP, 52 PE; 361/305, 306, 321, 328, 313, 386, 401, 402, 403

[56] References Cited

U.S. PATENT DOCUMENTS

| | | |
|---|---|---|
| 3,402,372 | 9/1968 | Wasyluk . |
| 3,859,592 | 1/1975 | Kessler ............................ 361/305 X |
| 3,909,638 | 9/1975 | Teraishi et al. ................. 361/321 X |
| 4,386,327 | 5/1983 | Ogawa .............................. 357/14 X |
| 4,577,215 | 3/1986 | Stewart et al. ..................... 357/23.5 |
| 4,744,008 | 5/1988 | Black et al. ..................... 361/321 X |

FOREIGN PATENT DOCUMENTS 2152753  8/1985  United Kingdom .

*Primary Examiner*—Donald A. Griffin
*Attorney, Agent, or Firm*—Angus C. Fox, III; Stanley N. Protigal; Jon Busack

[57] ABSTRACT

A decoupling capacitor system for improving the reliability of digital logic circuit boards such as single inline memory modules which use surface-mount decoupling capacitors. The system comprises one or more units of two or more series-connected capacitors connected between the chip supply voltage (Vcc) input and the chip ground (Vss) connection. Given no change in the reliability of the individual capacitors, the reliability of a circuit board can typically be improved by several order of magnitude.

15 Claims, 2 Drawing Sheets

SHORT-RESISTANT DECOUPLING CAPACITOR SYSTEM FOR SEMICONDUCTOR CIRCUITS

FIELD OF THE INVENTION

This invention relates to semiconductor devices, and more specifically to the improvement of transient-voltage filter circuits used on digital logic and digital memory circuit boards.

BACKGROUND OF THE INVENTION

Integrated semiconductor devices are typically constructed en masse on a wafer of silicon or gallium arsenide. Each device generally takes the form of an integrated circuit (IC) die, which is attached to a leadframe with gold wires. The die and leadframe are then encapsulated in a plastic or ceramic package, which is then recognizable as an IC "chip". IC chips come in a variety of forms such as dynamic random access memory (DRAM) chips, static random access memory (SRAM) chips, read only memory (ROM) chips, gate arrays, and so forth. The chips are interconnected in myriad combinations on printed circuit boards by any number of techniques, such as socketing and soldering.

Interconnections among chips arrayed on printed circuit boards are typically made by conductive traces formed by photolithography and etching processes. Semiconductor circuit devices, including DRAMs, SRAMs and gate arrays are essentially switching devices. As the output drivers within those chips create intermittent current flow on associated conductive traces, the traces behave as inductors, creating voltage surges which have the potential for creating logic errors. Other logicdamaging transient voltages, caused by voltage fluctuations at the power line and the interaction of other circuit components in the system, may also be present.

In order to render innocuous the transient voltages which regularly appear in logic circuits, decoupling capacitors are commonly used as lowfrequency bypass filters.

One circuit-board-mounted semiconductor chip array that is of particular interest is the Single Inline Memory Module (SIMM). A SIMM is a highly space-efficient memory expansion board having no onboard address circuitry. It is designed to be plugged directly into the address, data and powersupply buses of a computer so that cells within the chips comprising its randomly-addressable memory can be addressed directly by the computer's CPU rather than by a bank-switching technique commonly used for larger memory expansion boards. The SIMM's memory cells are perceived by the computer's CPU as being no different than memory cells within chips connected directly to the computer's motherboard. SIMMs are typically furnished in multiple-byte or multiple-word configurations. That is to say that for any eightbit byte or sixteen-bit word of information stored on a SIMM, each of the component bits will be found on a separate chip and will be individually addressable by column and row. One edge of a SIMM module is a card-edge connector, which plugs into a socket on the computer which is directly connected to the computer buses required for powering and addressing the memory on the SIMM.

FIG. 1 is a top plan view of a typical SIMM. This particular SIMM comprises a printed circuit board 11 on which nine 256K-bit DRAM chips D1 through D9 are surface mounted. Each of the DRAM chips has eighteen J-mount connector pins 13 which have been soldered, using infrared energy, to eighteen chip connector pads 21 (shown in FIG. 2) on the SIMM beneath each chip. Circuit board 11 has a card-edge connector 15 comprised of a series of thirty rectangular terminal pads 17 on each side of the board. Thirty terminal pads 17 are visible in FIG. 1. Card-edge connector 15 plugs into a socket on the computer motherboard, providing parallel connection to the computer's address, data, power and ground buses.

FIG. 2 is a top plan view of the SIMM of FIG. 1 with DRAM chips D1 through D9 removed, completely exposing the nine sets of eighteen chip connector pads 21, as well as eight of the nine surface-mount decoupling capacitors C1 through C9. Capacitor C9 has been removed in order to expose an upper capacitor mounting pad 23A and a lower capacitor mounting pad 23B. On this particular SIMM, each upper capacitor mounting pad 23A is connected to both the Vcc bus and, by means of upper conductive trace 25, to chip connector pad 21C, which is the Vcc input to the DRAM chip. Likewise, each lower capacitor mounting pad 23B is connected to both the ground-plane bus and, by means of lower conductive trace 27, to chip connector pad 21L, which is the DRAM chip's connection to ground. The Vcc bus and the ground-plane bus on circuit board 11 are not visible in the plan views of FIGS. 1 and 2, since those particular bus traces are located between two of the board's six layers.

From the foregoing description of the SIMM depicted in FIGS. 1 and 2, it will be noted that all nine of the SIMM's decoupling capacitors are connected in parallel between the Vcc bus and the ground plane bus. As long as the dielectric of each of the nine capacitors is intact, the module is functional. However, a short in any one of the nine capacitors will result in the Vcc bus becoming shorted to the ground-plane bus, whereupon the SIMM will begin to draw an inordinate amount of current which will invariably result in its destruction.

Decoupling capacitors of the surface-mount type are particularly susceptible to shorting, since they have no leads to thermally isolate them as they are soldered to a circuit board with infrared energy, at temperatures of up to 700 degrees Fahrenheit. Even if a surface-mount capacitor survives the mechanical shock generated by soldering process, it is still vulnerable to other types of mechanical stress that would not affect a lead-mounted capacitor. For example, by simply bending a SIMM having surface-mounted capacitors, the capacitors may be compromised. And, even if a SIMM passes testing following manufacture (an indication that none of the decoupling capacitors are initially shorted), it may have a relatively high failure rate when placed in use. SIMMs, of the type shown in FIG. 1, may have an average failure rate traceable to shorted decoupling capacitors as high as one per thousand.

Single inline packages (SIPs) are similar in design to SIMMs, except that instead of having a card edge-type connector, SIMMs have pins which are either socketably or solderably mounted on a bus. The problems associated with the decoupling capacitor system of SIMMs also apply to SIPs.

SUMMARY OF THE INVENTION

The object of the present invention is to improve the reliability of decoupling capacitors used in logic circuits. This has been accomplished by replacing a single decoupling capacitor connected between the chip supply voltage (Vcc) input and the chip ground (Vss) connection with a pair of decoupling capacitors connected in series between Vcc and Vss. Given no change in the reliability of the individual components, the reliability of a component such as a memory module can be dramatically improved.

DETAILED DESCRIPTION OF THE PREFERRED EMBODIMENT

Figure 1:
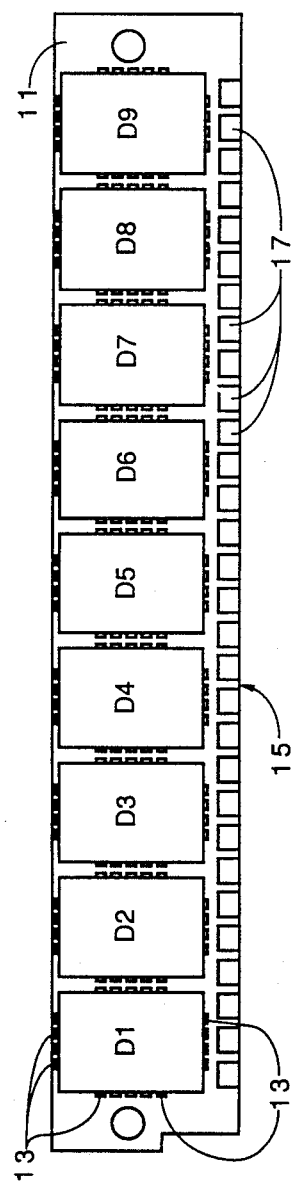
FIG. 1 is a top plan view of a typical SIMM.
Figure 2:
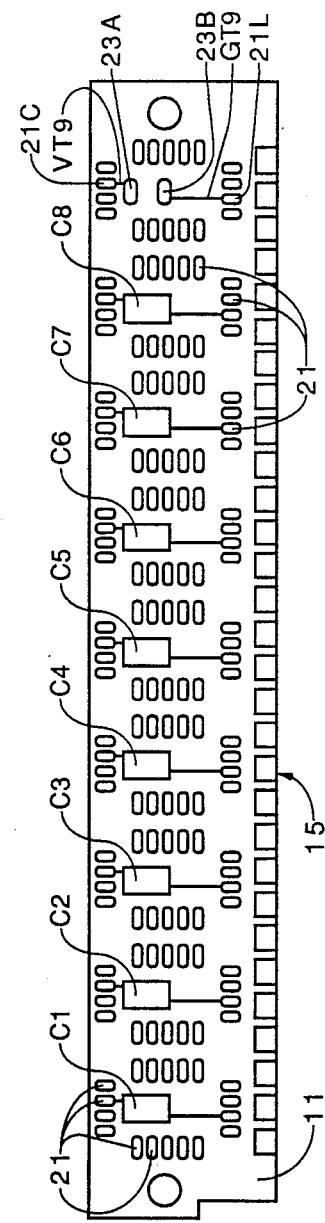
FIG. 2 is a top plan view of the SIMM of FIG. 1 with DRAM chips D1 through D9 removed.
Figure 3:
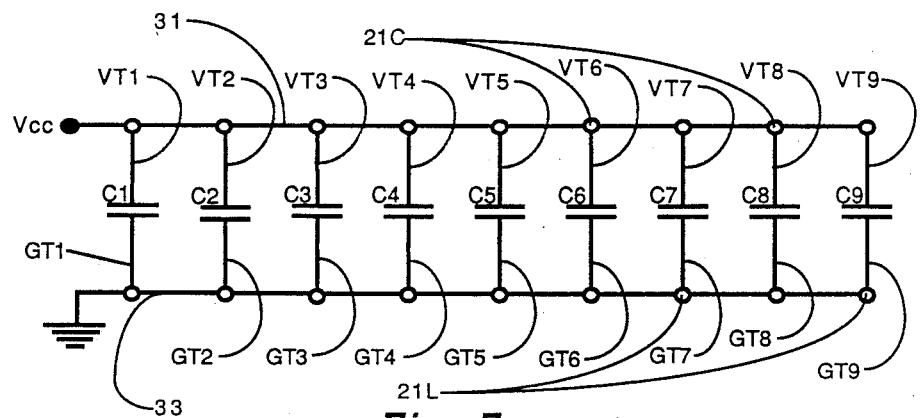
FIG. 3 is a schematic diagram of the decoupling capacitor circuit of the SIMM depicted in FIGS. 1 and 2.

Referring now to the schematic of FIG. 3, the decoupling capacitor circuit for the SIMM of Figures 1 and 2 is comprised of nine surface-mount capacitors C1 through C9 connected in parallel between the SIMM's Vcc bus 31 and its ground-plane (Vss) bus 33. Conductor VT1 represents the trace on circuit board 11 between the upper capacitor mounting pad 23A beneath capacitor C1 and DRAM chip D1's chip-mounting pad 21C. Conductor GT1 represents the trace on circuit board 11 between the lower capacitor mounting pad 23B beneath capacitor C1 and DRAM chip D1's chip-mounting pad 21L. In a like manner, conductors VT2 and GT2 connect the capacitor mounting pads 23A and 23B beneath capacitor C2 to DRAM chip D2's chip-mounting pads 21C and 21L, respectively. The conductive traces for capacitors C3 through C9 are similarly represented.

Figure 4:
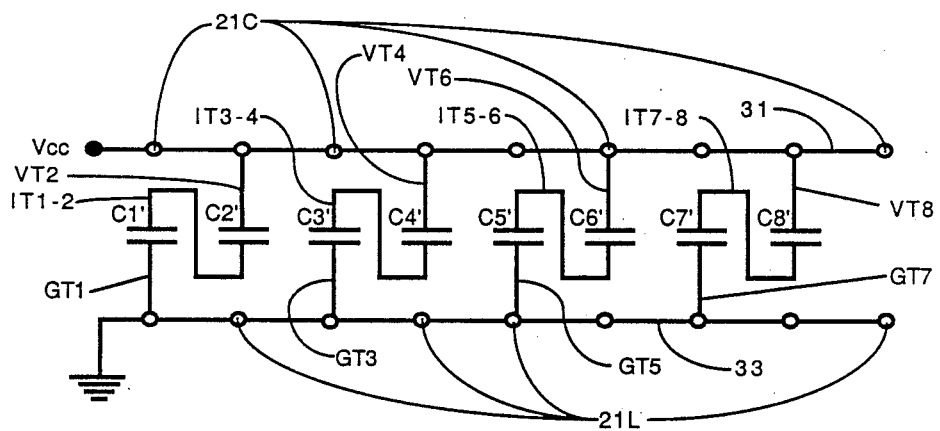
FIG. 4 is a diagram of the decoupling capacitor circuit of the SIMM depicted in FIGS. 1 and 2, as modified in accordance with the present invention.

Referring now to FIG. 4, the decoupling capacitor circuit of FIG. 3 has been modified such that each odd-numbered Vcc to capacitor trace (VT1, VT3, VT5 and VT7) and each even numbered ground-to-capacitor trace (GT2, GT4, GT6 and GT8) have been eliminated, and new interconnecting traces IT1-2, IT3-4, IT5-6 and IT7-8, which connect capacitor pairs C1' and C2', C3' and C4', C5' and C6' and C7' and C8' in series have been created. Because there are an odd number of DRAM chips on this particular SIMM, the decoupling capacitor beneath DRAM chip D9 has been eliminated altogether. However, capacitive decoupling for DRAM chip D9 is still sufficient, since the newly-created capacitor pair C1' and C2', C3' and C4', C5' and C6', and C7' and C8' are connected in parallel between the SIMM's Vcc and ground-plane buses. The Vcc input to chip D9 is, of course, still connected to the SIMM's Vcc bus, and the connection to ground for chip D9 also remains connected to the SIMM's ground-plane bus.

The only component change required to maintain the capacitance of the circuit of FIG. 4 at approximately the same level as that of the circuit of FIG. 3 is the replacement of the original capacitors with those of double the capacitance, since the total capacitance of two identical capacitors in series is only half the capacitance of each.

The capacitor decoupling circuit of FIG. 4 is far less likely to fail on account of a shorted capacitor than is the circuit of FIG. 3. For example, if the probability of any individual decoupling capacitor shorting is 0.0001, then the probability that the circuit of FIG. 3 will fail on account of capacitor failure is $1-(1-0.0001)^9$, or approximately 0.0009 (nearly one per thousand). However, for the circuit of FIG. 4, given the same individual capacitor fail rate, the reliability of any of the four pairs of capacitors $1-(0.0001)^2$, or 0.99999999; hence, the probability that one or more the four pairs on the board will fail is $1-(0.99999999)^4$, or approximately 0.00000004 (roughly one in twenty-five million). The foregoing comparison is not entirely fair, since only four pairs of series-connected capacitors (the pairs all connected in parallel between the Vcc bus and the ground bus) are compared with nine individual capacitors connected in parallel between the Vcc bus and the ground bus. For nine pairs of series-connected capacitors, the probability of board failure would be $1-(0.99999999)^9$, or approximately 0.00000009 (roughly one in eleven million). However, either figure is a quantum improvement over a failure rate of nearly one per thousand.

Although the invention as described is particularly applicable to SIMMs and SIPs because of the common use of surface-mount decoupling capacitors in those devices, the invention is also applicable to many types of digital circuitry where high reliability is of paramount importance. Therefore, although the preferred embodiment of the invention and the following claims are directed primarily to memory devices, other embodiments are covered by the scope and spirit of the claims.

We claim:

1. In combination with a digital memory expansion board having an array of row-and-column-addressable memory cells, which is designed to be directly connected in parallel with the data, address, Vcc and Vss buses of a computer, a decoupling capacitor system on said board connected between the Vcc bus and the Vss bus comprising two or more series-connected capacitors.

2. The decoupling capacitor system of claim 1 which further comprises multiple units of two or more series-connected capacitors, said units being connected in parallel between the Vcc bus and the Vss bus.

3. The decoupling capacitor system of claim 1, wherein said array is a multiple-byte configuration comprised of essentially identical memory chips, with each memory chip contributing one bit to each addressable byte of information.

4. The decoupling capacitor system of claim 3, wherein said array is a single inline memory module (SIMM).

5. The decoupling capacitor system of claim 3, wherein said array is a single inline package (SIP).

6. The decoupling capacitor system of claim 1, wherein said memory expansion module is a single inline memory module (SIMM).

7. The decoupling capacitor system of claim 1, wherein said memory expansion module is a single inline package (SIP).

8. The decoupling capacitor system of claim 1, wherein information is stored into the array and retrieved from the array with high and low-state voltage signals.

9. In combination with a circuit-board-mounted array of row-and-column-addressable digital logic components, a decoupling capacitor system between a Vcc bus and a Vss bus comprising two or more series-connected capacitors.

10. The decoupling capacitor system of claim 9 Which further comprises multiple units of two or more series-connected capacitors, said units being connected in parallel between the Vcc bus and the Vss bus.

11. The decoupling capacitor system of claim 9, wherein said array is comprised of gate array chips.

12. In combination with a digital memory expansion board having a series of essentially identical memory chips, each of which provides one bit of information for each byte or word of information stored on said board, a decoupling capacitor system on said board connected between a Vcc bus and a Vss bus comprising two or more series-connected capacitors.

13. The decoupling capacitor system of claim 12 which further comprises multiple units of two or more series-connected capacitors, said units being connected in parallel between the Vcc bus and the Vss bus.

14. The decoupling capacitor system of claim 13 wherein each of said series-connected capacitors is of the surface-mount type.

15. The decoupling capacitor system of claim 14, wherein each of said series-connected capacitors is mounted beneath said memory chips.

* * * * *